United States Patent [19]
Holley et al.

[11] Patent Number: 5,639,311
[45] Date of Patent: Jun. 17, 1997

[54] METHOD OF CLEANING BRUSHES USED IN POST CMP SEMICONDUCTOR WAFER CLEANING OPERATIONS

[75] Inventors: Brian Holley, Wappingers Falls, N.Y.; Andrew Sauer, Sherman, Conn.; Herman Schmitt, Hopewell Jct., N.Y.

[73] Assignee: International Business Machines Corporation, Armonk, N.Y.

[21] Appl. No.: 477,790

[22] Filed: Jun. 7, 1995

[51] Int. Cl.$^6$ ............................................. B08B 3/08
[52] U.S. Cl. ..................... 134/6; 134/33; 134/38; 15/1; 15/77; 15/88.3
[58] Field of Search ..................... 134/6, 33, 32, 134/25.1, 38; 15/1, 77, 88.3

[56] References Cited

U.S. PATENT DOCUMENTS

| | | | |
|---|---|---|---|
| 5,078,801 | 1/1992 | Malik | 134/29 |
| 5,122,195 | 6/1992 | Hoffman | 134/38 |
| 5,144,711 | 9/1992 | Gill, Jr. | 15/97.1 |
| 5,167,667 | 12/1992 | Prigge et al. | 8/137 |
| 5,320,706 | 6/1994 | Blackwell | 156/636 |
| 5,384,931 | 1/1995 | Hanson | 15/246 |

OTHER PUBLICATIONS

IBM Technical Disclosure Bulletin, vol. 20, No. 3, Aug. 1977, "Steam and Water Spray Wafer Cleaning", Deighton.
IBM Technical Disclosure Bulletin, vol. 26, No. 10A, Mar. 1984, "Non–Contact Semiconductor Wafer Cleaning", Holley.
"PVA Clean Sponge Material", Rippey Corporation.
"DSS–200 Series I", OnTrak Systems, Inc.

*Primary Examiner*—Jill Warden
*Attorney, Agent, or Firm*—Delio & Peterson, LLC; Aziz M. Ahsan; Peter W. Peterson

[57] ABSTRACT

A method of cleaning brushes used in post chemical-mechanical polishing of semiconductor wafers employs water blanks treated with a hydrofluoric acid to render the surface hydrophobic. When an undesirable amount of cleaning residue builds up brushes, the treated wafer blanks are passed between brushes to attract and remove the residue.

20 Claims, 1 Drawing Sheet

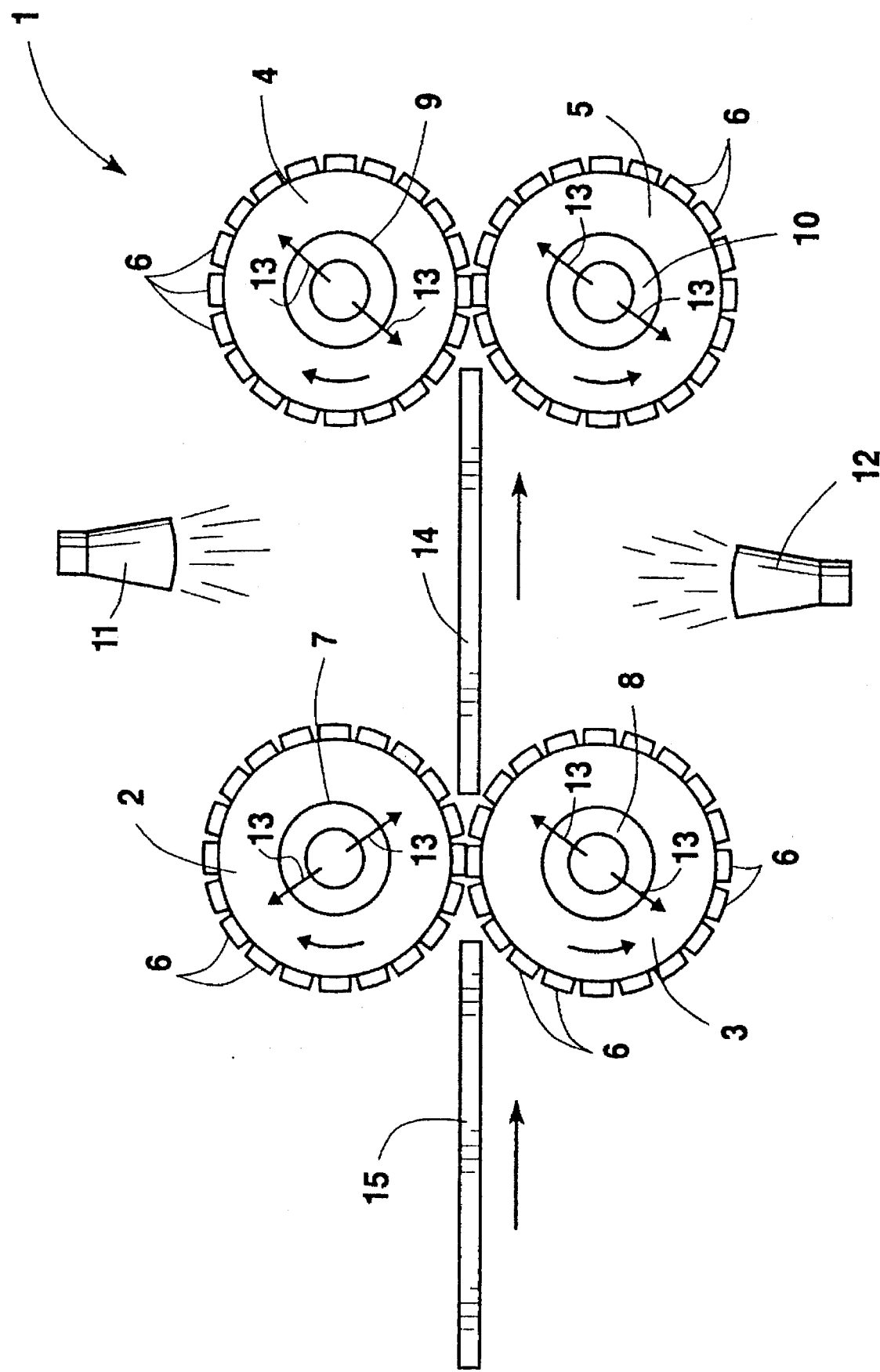

METHOD OF CLEANING BRUSHES USED IN POST CMP SEMICONDUCTOR WAFER CLEANING OPERATIONS

BACKGROUND OF THE INVENTION

1. Field of the Invention

This invention relates to a method of maintaining and cleaning brushes which remove semiconductor wafer cleaning compositions and, in particular, to a method of removing residual cleaning compositions from the brushes.

2. Description of Related Art

The presence of foreign material on semiconductor wafers presents a serious problem to the manufacture of integrated circuits on the wafers. In processing semiconductors, the wafers are normally initially polished to planarize the surface prior to subsequent processing to deposit the desired circuits. Chemical-mechanical polishing (CMP) is typically used and requires the introduction of a polishing slurry onto the surface of the semiconductor wafer as it is mechanically polished on a polishing table. The slurries typically are water based and may contain fine abrasive particles and incorporate chemical cleaning compositions, such as silica ($SiO_2$), and alumina ($Al_2O_3$). After polishing is complete, the wafers must be cleaned to completely remove residual slurry and other cleaning compositions in order that the surface be made ready for subsequent photolithographic processing and other manufacturing steps.

Brush cleaning utilizing cylindrical brushes have been typically used to clean residual cleaning compositions from the surfaces of semiconductor wafers. As these cleaning brushes remove the residual cleaning composition from the wafer surface, the residue builds up on the surface of and within the brushes themselves. These brushes may be made of a foam such as polyvinyl alcohol (PVA). In prior art systems, it has not been effective to clean such brushes and they typically have been discarded after an undesirable amount of residual cleaning composition has been built up on the brush. Because of cost pressures, these dirty brushes are sometimes utilized beyond the point where they should be replaced, which has resulted in inconsistent levels of cleanliness on the wafers from batch-to-batch and job-to-job, and has contributed to lowering yield of semiconductor product wafers.

Bearing in mind the problems and deficiencies of the prior art, it is therefore an object of the present invention to provide an improved method of maintaining and cleaning brushes which remove semiconductor wafer cleaning compositions whereby residual cleaning compositions are efficiently and thoroughly removed from the brushes.

It is another object of the present invention to provide a method of maintaining and cleaning brushes which permits the brushes to be reused after they would normally be discarded due to buildup of residual cleaning composition.

A further object of the invention is to provide a method of reducing the cost of maintaining semiconductor wafer cleaning brushes.

It is yet another object of the present invention to provide a method of maintaining and cleaning semiconductor wafer cleaning brushes which attains more consistent cleaning of wafers from batch to batch.

It is a further object of the present invention to provide a method of extending the lifetime of semiconductor wafer cleaning brushes.

Still other objects and advantages of the invention will in part be obvious and will in part be apparent from the specification.

SUMMARY OF THE INVENTION

The above and other objects, which will be apparent to those skilled in the art, are achieved in the present invention which provides in one aspect a method of cleaning brushes used to removing semiconductor wafer cleaning compositions comprising the steps of:

a) providing a dirty wafer cleaning brush, the dirty wafer cleaning brush having been used to remove cleaning compositions from semiconductor wafers and containing at least one residual cleaning composition therein;

b) providing a wafer blank having a clean, treated, hydrophobic surface attractive to the residual cleaning composition;

c) contacting the wafer blank surface with the dirty wafer cleaning brush while moving the brush relative to the wafer blank surface;

d) removing the residual cleaning composition from the wafer cleaning brush onto the hydrophobic surface of the wafer blank; and e) continuing the steps (c) and (d) until a desired amount of residual cleaning composition is removed from the wafer cleaning brush.

In another aspect, the present invention relates to a method of maintaining brushes used to remove semiconductor wafer cleaning compositions comprising the steps of:

a) providing a wafer cleaning system, the cleaning system including at least one brush for removing a residual cleaning composition from wafers;

b) cleaning a plurality of semiconductor product wafers, each product wafer having on a surface thereof a residual cleaning composition, by contacting the product wafer surface with the brush to remove residual cleaning composition from the product wafer surface onto the brush, the cleaning continuing until the wafer cleaning brush contains an amount of the residual cleaning composition;

c) providing a wafer blank having a clean, treated, hydrophobic surface attractive to the residual cleaning composition;

d) contacting the wafer blank surface with the wafer cleaning brush containing the residual cleaning composition while moving the brush relative to the wafer blank surface;

e) removing the residual cleaning composition from the wafer cleaning brush onto the hydrophobic surface of the wafer blank;

f) continuing the steps (d) and (e) until a desired amount of residual cleaning composition is removed from the wafer cleaning brush; and g) subsequently reusing the wafer cleaning brush to clean a plurality of wafer blanks containing residual cleaning composition.

Preferably, the brush is a tubular foam brush comprising polyvinyl alcohol and the step (d) comprises rotating the brush while contacting the wafer blank. The residual cleaning composition is typically a water based slurry containing a polishing composition such as silica or alumina. The wafer blank may be made from silicon, silicon nitride or silicon oxide and etched with a solution of hydrofluoric acid.

In a further aspect, the present invention provides a method of maintaining a system for removing semiconductor wafer cleaning compositions comprising the steps of:

a) providing a wafer cleaning system, the cleaning system including at least one pair of dirty tubular, foam wafer cleaning brushes, the brushes being rotatably mounted on parallel spindles such that both brushes are adapted to contact opposite surfaces of a semiconductor wafer passing therebetween, the dirty wafer cleaning brush having been used to remove cleaning compositions from semiconductor wafers and containing at least one residual cleaning composition therein;

b) providing a wafer blank having opposite clean, treated, hydrophobic surfaces attractive to the residual cleaning composition;

c) contacting the wafer blank surfaces with the dirty wafer cleaning brushes by rotating the brushes while passing the wafer blank between the brushes;

d) removing the residual cleaning composition from the wafer cleaning brushes onto the hydrophobic surfaces of the wafer blank; and e) continuing the steps (c) and (d) until a desired amount of residual cleaning composition is removed from the wafer cleaning brushes.

BRIEF DESCRIPTION OF THE DRAWINGS

The features of the invention believed to be novel and the elements characteristic of the invention are set forth with particularity in the appended claims. The drawing is for illustration purposes only and are not drawn to scale. The invention itself, however, both as to organization and method of operation, may best be understood by reference to the detailed description which follows taken in conjunction with the accompanying drawing in which the FIGURE illustrates side elevational view of a post-CMP wafer cleaning system incorporating the preferred embodiment of the brush cleaning and maintenance method of the present invention.

DESCRIPTION OF THE PREFERRED EMBODIMENT(S)

In describing the preferred embodiment of the present invention, reference will be made herein to the drawing FIGURE in which like numerals refer to like features of the invention. Features of the invention are not necessarily shown to scale in the drawing.

The preferred embodiment of the method of cleaning brushes used in post CMP cleaning operations is employed in connection with resilient foam brushes such as those used on the Series 0 wafer cleaning system manufactured by OnTrak Systems, Inc. of Milpitas, Calif. This system employs multiple sequential cleaning stations wherein each station comprises a pair of tubular brushes made of polyvinyl alcohol (PVA) in the form of a foam. Each brush has a length of approximately 10 in. (25 cm), an outside diameter of approximately 2¼ in. (5.7 cm) and an inside diameter of approximately 1¼ in. (3.2 cm), and has an outer cylindrical surface covered with foam projections approximately ¼ in. (0.6 cm) in height and A in. (0.6 cm) in diameter. Each brush is rotatably mounted on a spindle through which may be pumped water to saturate the brush and the brushes at each station are spaced so that the surfaces approximately contact each other. Given the resilience of the foam, this permits thin semiconductor wafers containing the cleaning composition residue to pass between the pairs of brushes as they rotate. Typically, as the cleaning system will have two (2) stations, with each station having a pair of the brushes as described above. The wafers pass directly from one station through the other.

In order to remove the slurry or other residue, deionized water is pumped through holes in the spindle to saturate the tubular brushes. Additionally, deionized water sprayed from nozzles above and below impinges the wafers. As the brushes rotate over the surface of the wafer, they tend to pick up and trap in the brush surface particles of the slurry and other residue of the cleaning composition. The slurries which eventually contaminate the cleaning brushes and render them ineffective for further cleaning comprise the slurries and other cleaning compositions described in the background section of this application.

As shown in the Figure, the semiconductor product wafer cleaning system 1 has two brush stations, the first comprising cylindrical PVA brushes 2 and 3, and the second comprising cylindrical PVA brushes 4 and 5. On each of the brushes there are projections 6 also made of PVA. The brushes are mounted on spindles 7, 8, 9 and 10 so that they are barely touching and rotate in the directions indicated. Deionized water is sprayed from nozzles 11 and 12 and pumped 13 through the brushes from the spindles. The combination of the water and brush contact acts to remove residual cleaning composition from a semiconductor product wafer 14 which is passed through the brushes in the cleaning stations.

The semiconductor product wafers which may be cleaned by the system referenced herein include silicon, silicon nitride, silicon oxide, polysilicon or various metals and alloys. As used herein the term "product wafer" refers to the wafer which is to be intended to be produced in a final semiconductor device by further treatment. The CMP compositions which are used to planarize or otherwise treat and polish the surface of the semiconductor product wafers must be removed to a sufficient degree so that subsequent manufacture and deposition steps may be made to a clean surface.

In prior art methods, once the cleaning brushes become loaded up with the contaminating slurry and get dirty, they are typically changed and replaced by new, fresh brushes. The dirty brushes are then typically discarded. In accordance with the present invention, these dirty brushes may be cleaned by contacting them with a treated, hydrophobic surface for example on a wafer blank. As used herein, the term "wafer blank" refers to the wafers not intended for production but utilized for cleaning purposes as described above. The treated hydrophobic surface of the wafer pulls and attracts particles and other composition residue out of the brush so that it either remains on the wafer surface or otherwise is removed from the brushes.

The preferred treated wafer blank is made using a silicon wafer blank of approximately 8 in. (20 cm) in diameter and 0.29 in. (0.74 ram) in thickness. Other wafer blank materials suitable for use in the present invention include silicon oxide ($SiO_2$), silicon nitride ($Si_3N_4$) and other materials which have sufficient hydrophobic properties to remove abrasive and other residues from the brushes. This wafer blank is then etched with an acid or other composition which renders the surface more hydrophobic than it normally or originally is. In the preferred embodiment of the present invention, hydrofluoric acid is employed as the etchant. The hydrofluoric acid may be diluted in distilled water to a ratio from about 40:1 to about 100:1, water to acid. Etching may take place by immersing or otherwise contacting the wafer blank surface with the aqueous acidic solution for a time sufficient to render the surface hydrophobic. The etching process may take place at room temperature and normally takes from one (1) to five (5) minutes.

One or both sides of the wafer blank may be treated so that, in the system described above, the wafer may be passed between each pair of brushes at a cleaning station so that contamination is removed from each of the brushes simultaneously. It has been found that four (4) to eight (8) treated wafer blanks may be used to clean the brushes after approximately 100 and 200 semiconductor product wafers have been cleaned.

Referring back to the FIGURE, after a desired interval of cleaning semiconductor product wafers and observed build-up of residue on the brushes, wafer blank 15 having opposite treated, hydrophobic surfaces is passed through the brush stations of cleaning system 1. Because a wafer of the same size as the product wafer is used as the treated wafer blank, the same wafer handling fixtures (not shown) may be utilized in the brush cleaning portion of the process.

Typically, prior art brushes have been found to degrade to the point of needing replacement after approximately 2,000 wafer passes. By practicing the treatment described herein, brush life has been found to be doubled, thereby extending the life time of the brushes and reducing cleaning costs. Additionally, intermittent cleaning of the brushes results in more consistent cleaning of wafers from batch-to-batch and job-to-job. The brush cleaning and maintenance system of the present invention efficiently and thoroughly removes residual cleaning composition from the brushes and permits the brushes to be reused after they would normally be discarded due to build-up of residual cleaning composition.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of cleaning brushes used for removing semiconductor wafer cleaning compositions comprising the steps of:
   a) providing a dirty wafer cleaning brush, said dirty wafer cleaning brush having been used to remove cleaning compositions from semiconductor wafers and containing at least one residual cleaning composition therein;
   b) providing a wafer blank having a clean, treated, hydrophobic surface attractive to said residual cleaning composition;
   c) contacting the wafer blank surface with said dirty wafer cleaning brush while moving said wafer cleaning brush relative to said wafer blank surface;
   d) removing said residual cleaning composition from said wafer cleaning brush onto the hydrophobic surface of said wafer blank; and
   e) continuing said steps (c) and (d) to remove residual cleaning composition from said wafer cleaning brush.

2. The method of claim 1 wherein said brush is a tubular foam brush and wherein said step (c) comprises rotating said brush while contacting said wafer blank.

3. The method of claim 1 wherein said brush comprises polyvinyl alcohol.

4. The method of claim 1 wherein said residual cleaning composition is selected from the group consisting of silica and alumina.

5. The method of claim 1 wherein said residual cleaning composition comprises a water based slurry containing a polishing composition.

6. The method of claim 1 wherein said wafer blank is selected from the group consisting of silicon, silicon nitride and silicon oxide.

7. The method of claim 1 wherein said wafer blank surface is etched with a solution of hydrofluoric acid.

8. The method of claim 1 wherein said step (a) comprises providing a pair of dirty, tubular foam wafer cleaning brushes, said brushes being rotatably mounted on parallel spindles such that both brushes contact opposite surfaces of a wafer passing therebetween, and wherein said step (c) comprises rotating said brushes while passing said wafer blank between said brushes.

9. The method of claim 1 wherein said residual cleaning composition is a water based slurry containing a polishing composition selected from the group consisting of silica and alumina.

10. The method of claim 1 wherein said wafer blank is selected from the group consisting of silicon, silicon nitride and silicon oxide having surfaces etched with a solution of hydrofluoric acid.

11. A method of cleaning brushes used for removing semiconductor wafer cleaning compositions comprising the steps of:
   a) providing a wafer cleaning system, said cleaning system including at least one brush for removing a residual cleaning composition from wafers;
   b) cleaning a plurality of semiconductor product wafers, each product wafer having on a surface thereof a residual cleaning composition, by contacting the product wafer surfaces with said brush to remove residual cleaning composition from the product wafer surfaces onto said brush, until said at least one brush contains residual cleaning composition;
   c) providing a wafer blank having a clean, treated, hydrophobic surface attractive to said residual cleaning composition;
   d) contacting the wafer blank surface with said wafer cleaning brush containing said residual cleaning composition while moving said brush relative to said wafer blank surface;
   e) removing said residual cleaning composition from said wafer cleaning brush onto the hydrophobic surface of said wafer blank;
   f) continuing said steps (d) and (e) until a desired amount of residual cleaning composition is removed from said wafer cleaning brush; and
   g) subsequently reusing said wafer cleaning brush to clean a plurality of wafer blanks containing residual cleaning composition.

12. The method of claim 11 wherein said brush is a tubular foam brush and wherein said step (d) comprises rotating said brush while contacting said wafer blank.

13. The method of claim 11 wherein said brush comprises polyvinyl alcohol.

14. The method of claim 11 wherein said residual cleaning composition is selected from the group consisting of silica and alumina.

15. The method of claim 11 wherein said residual cleaning composition comprises a water based slurry containing a polishing composition.

16. The method of claim 11 wherein said wafer blank is selected from the group consisting of silicon, silicon nitride and silicon oxide.

17. The method of claim 11 wherein said wafer blank surface is etched with a solution of hydrofluoric acid.

18. The method of claim 11 wherein in said step (a) said wafer cleaning system comprises a pair of tubular foam wafer cleaning brushes, said brushes being rotatably mounted on parallel spindles such that both brushes contact opposite surfaces of a wafer passing therebetween, and wherein said steps (b) and (d) comprise rotating said brushes while passing said wafers between said brushes.

19. A method of cleaning a system for removing semiconductor wafer cleaning compositions comprising the steps of:

a) providing a wafer cleaning system, said cleaning system including at least one pair of dirty tubular, foam wafer cleaning brushes, said brushes being rotatably mounted on parallel spindles such that both brushes are adapted to contact opposite surfaces of a semiconductor wafer passing therebetween, said dirty wafer cleaning brushes having been used to remove cleaning compositions from semiconductor wafers and containing at least one residual cleaning composition therein;

b) providing a wafer blank having opposite clean, treated, hydrophobic surfaces attractive to said residual cleaning composition;

c) contacting the wafer blank surfaces with said dirty wafer cleaning brushes by rotating said brushes while passing said wafer blank between said brushes;

d) removing said residual cleaning composition from said wafer cleaning brushes onto the hydrophobic surfaces of said wafer blank; and e) continuing said steps (c) and (d) until residual cleaning composition is removed from said wafer cleaning brushes.

20. The method of claim 19 wherein said brushes comprise polyvinyl alcohol.

* * * * *